United States Patent [19]

Nicholson

[11] 4,250,390
[45] Feb. 10, 1981

[54] APPARATUS FOR IRRADIATING A SURFACE

[76] Inventor: James Nicholson, "Kestlyn" Tinwall Downs Rd., Dumfries, Scotland, BG1 1TS

[21] Appl. No.: 25,634

[22] Filed: Mar. 30, 1979

[30] Foreign Application Priority Data

Apr. 11, 1978 [GB] United Kingdom ............ 14132/78

[51] Int. Cl.³ .................................................. G01J 1/00
[52] U.S. Cl. .................................. 250/504 R; 250/494
[58] Field of Search ............... 250/493, 494, 503, 504, 250/511, 514; 34/4; 350/299; 313/113, 114, 12

[56] References Cited

U.S. PATENT DOCUMENTS

| 1,303,273 | 5/1919 | Evans | 250/511 |
|---|---|---|---|
| 1,976,545 | 10/1934 | Doane | 250/494 |
| 2,298,824 | 10/1942 | Darley . | |
| 2,561,341 | 7/1951 | Clark | 250/504 |
| 3,558,873 | 1/1971 | Smith . | |
| 3,868,182 | 5/1973 | Kidd . | |
| 3,980,407 | 9/1976 | Hill | 250/511 |

FOREIGN PATENT DOCUMENTS 284537 3/1914 Fed. Rep. of Germany .
1427419 3/1976 United Kingdom .

*Primary Examiner*—Bruce C. Anderson
*Attorney, Agent, or Firm*—Charles A. Blank

[57] ABSTRACT

Apparatus for irradiating a surface, for example, for irradiating a photopolymer printing roll with ultra-violet light. The apparatus utilizes elongated radiation sources with individual reflectors directing the radiation to crossed planar mirror systems which re-direct the radiation toward the printing roll. The part of the mounting means for each radiation source at the end of the source between the sources is shielded from its respective mirror system by the rear surface of the other mirror system to expose the roll to substantially uniform intensity of radiation along substantially the entire length of the roll.

10 Claims, 6 Drawing Figures

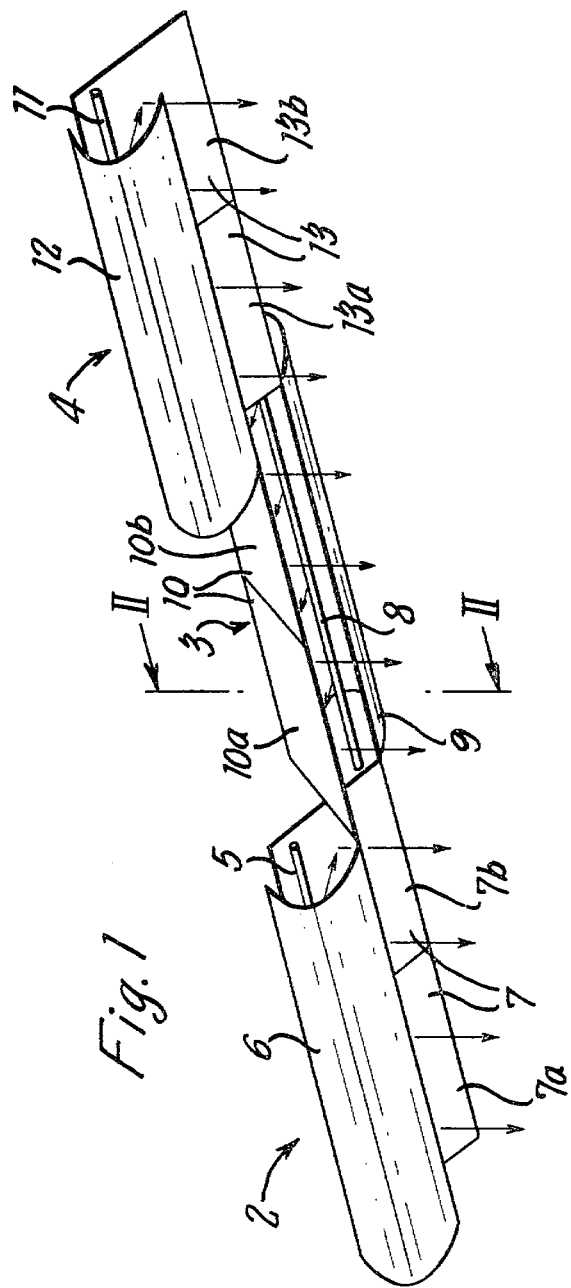

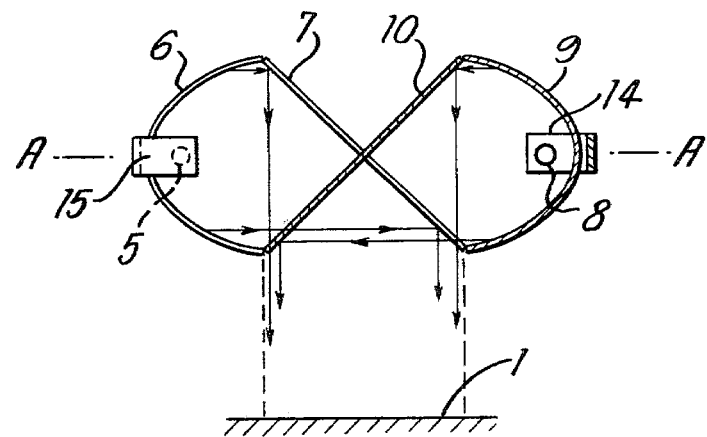
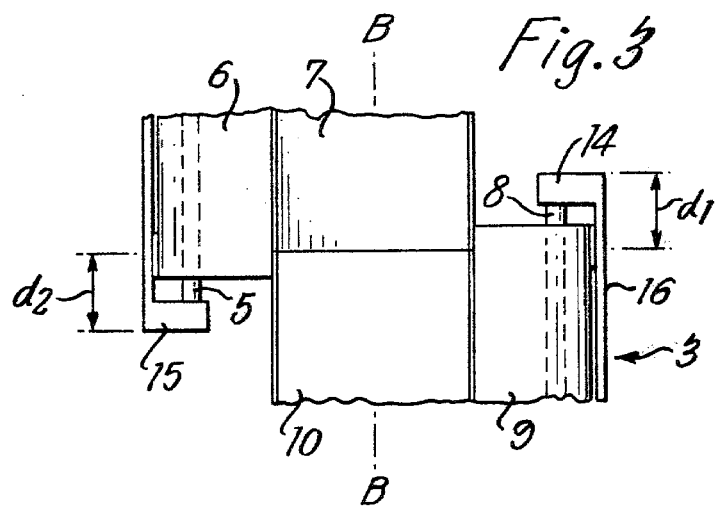

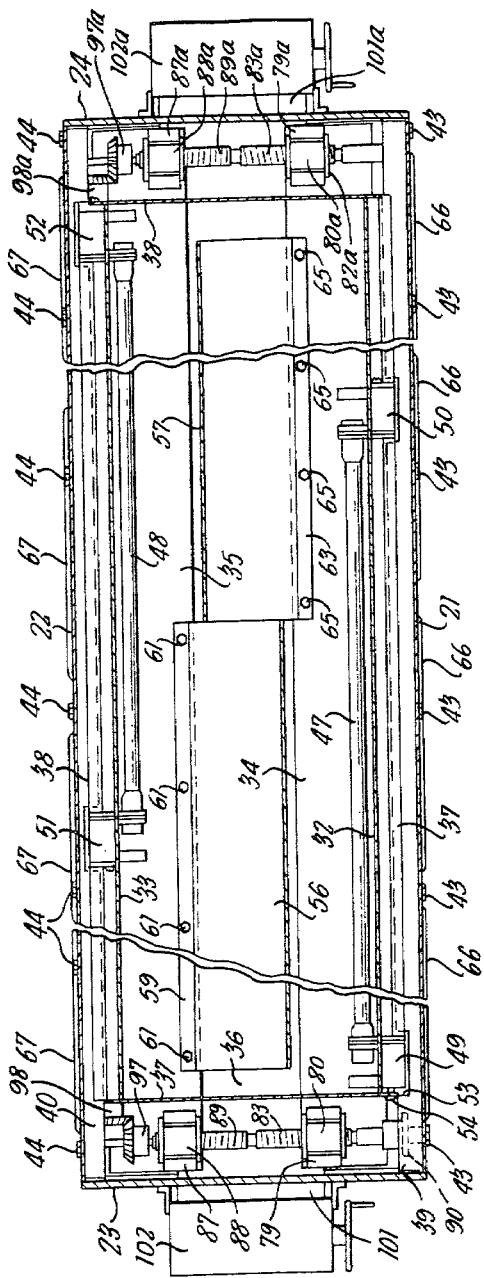

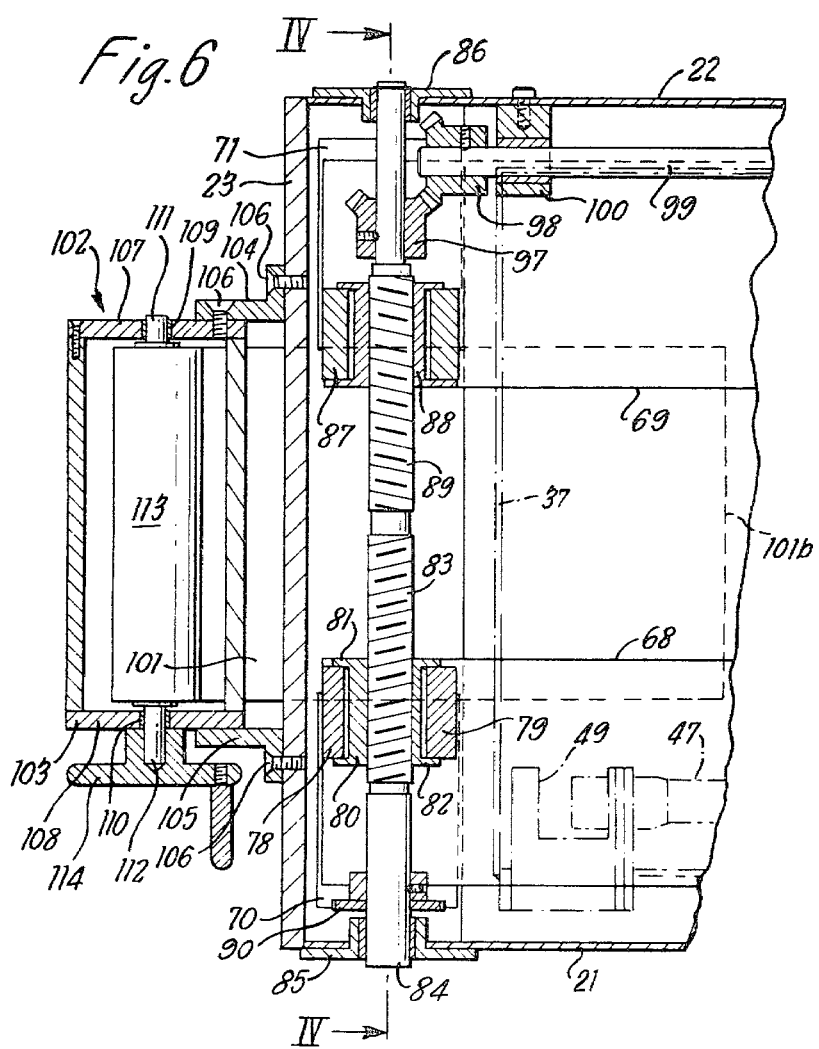

APPARATUS FOR IRRADIATING A SURFACE

This invention relates to apparatus for irradiating a surface.

In order to expose an elongated surface to radiation along the entire length of the surface it is necessary to arrange a series of radiant energy sources in such a manner that they will irradiate individual sections of the surface. In particular, when radiant energy tubes have been used as the source of radiation the tubes have had to be arranged over the surface to irradiate the entire length thereof, as there is a limit on the maximum tube length that is available. Using conventionally known arrangements of tubes and reflectors a problem arises in that part of the surface is exposed to an area at each end of each tube where the tube end connections are situated. The presence of these "dead" areas lead to variations in the intensity of irradiation along the length of the surface.

There are many fields wherein it is required to expose an elongated surface to radiation in such a way that the radiation is substantially uniform along the entire length of the surface, and the object of the present invention is to provide apparatus which facilitates this.

As used in this specification and the claims, the term "light radiation" is meant to include invisible light such as ultra-violet light.

According to the present invention apparatus for use in providing radiation along an elongated surface in such a manner that the intensity of the radiation may be substantially uniform along substantially the entire length of the surface comprises first mounting means for mounting a first elongated source of radiation; second mounting means for mounting a second elongated source of radiation in such a way that the longitudinal axis of the sources lie in a common plane which includes the longitudinal axis of the apparatus and that the first and second sources lie to opposite sides of the longitudinal axis of the apparatus and partially overlap in the axial direction; a first reflector for directing radiation from the first source in a first band of substantially uniform intensity towards the longitudinal axis of the apparatus and generally parallel to the common plane; a first substantially planar mirror system extending at substantially 45° to the common plane for reflecting the first band of radiation through substantially 90° and towards the surface; a second reflector for directing radiation from the second source in a second band of substantially uniform intensity towards the longitudinal axis of the apparatus and generally parallel to the common planar; and a second substantially plane mirror system extending at substantially 90° to the first substantially plane mirror system for reflecting the second band of radiation through substantially 90° and towards the surface; the first and second substantially planar mirror systems having adjacent ends which are contiguous along the axis of the apparatus, that part of the first mounting means for mounting a first end of the first source being shielded from the first substantially planar mirror system by the rear surface of the second substantially planar mirror system, and that part of the second mounting means for mounting a first end of the second source being shielded from the second substantially planar mirror system by the rear surface of the first substantially planar mirror system.

By arranging that the first ends of the first and second sources are each shielded from its associated substantially planar mirror system by the rear surface of the substantially planar mirror system associated with the other source, it will be apparent that any "dead" area at those ends of the sources will be masked from the surface to be irradiated. The surface is thus exposed to a continuous band of radiation along the total length of the mirror system and as each mirror of the system may be exposed to a length of the source that radiates substantially uniformly it follows that the irradiation of the surface will be substantially uniform, within the tolerance of uniformity of output of the individual sources, and with the possible exception of end regions of the surface. Uniform irradiation of the end regions can be ensured by shielding the second ends of the sources from their respective substantially planar mirror systems by shields of any suitable design, or by arranging that the reflected bands of radiation pass to the surface through a common slot extending in a plane parallel to the common plane and having a longitudinal axis parallel to the longitudinal axis of the apparatus and coplanar therewith in a plane perpendicular to the common plane, and limiting the axial length of the slot to less than the combined axial length of the substantially planar mirror systems so that the extreme ends of those combined systems are shielded from the surface.

In one embodiment of the invention only two sources are used. In an alternative embodiment the apparatus also comprises third mounting means for mounting a third elongated source of radiation in such a way that the longitudinal axis of the third source lies in said common plane, the third source is axially spaced from the first source, and the second and third sources lie to opposite sides of the longitudinal axis of the apparatus and partially overlap in the axial direction; a third reflector for directing radiation from the third source in a third band of substantially uniform intensity towards the longitudinal axis of the apparatus and generally parallel to the common plane; a third substantially planar mirror system for reflecting the third band of radiation through substantially 90° and towards the surface, the third substantially planar mirror system being substantially coplanar with and axially spaced from the first substantially planar mirror system and having an end which is adjacent to an end of the second substantially planar mirror system and is contiguous therewith along the axis of the apparatus, that part of the third mounting means for mounting a first end of the third source being shielded from the third substantially planar mirror system by the rear surface of the second substantially planar mirror system and that part of the second mounting means for mounting a second end of the second source being shielded from the second substantially planar mirror system by the rear surface of the third substantially planar mirror system. Similar masking effects occur in the regions of contiguity of the first and second, and of the second and third substantially planar mirror systems. By using three sources it is possible to irradiate longer surfaces. If still longer surfaces are to be treated then it is obviously possible, and within the scope of the invention, to add additional mounting means, arranged so that each source and reflector lie to the opposite side of the longitudinal axis of the apparatus from the or each axially adjacent source and reflector and that each substantially planar mirror system faces towards its associated source and reflector and lies at substantially 90° to the or each immediately adjacent substantially planar mirror system and is contiguous therewith along the longitudinal axis of the apparatus.

Preferably the mounting means are such that the longitudinal axis of the sources of radiation are equally spaced from the longitudinal axis of the apparatus; the reflectors are of similar size transverse to the axial direction, of similar reflectance and are equally spaced from their respective sources; and the substantially planar mirror systems are of similar size transverse to the axial direction, of similar reflectance and are equally spaced from their respective sources. Using this arrangement equal optical paths and properties are obtained for each band of radiation, so that uniform irradiation of the surface is obtained with the tolerance of uniformity of output of the individual sources. Differing sources could be used by varying the optical path and properties of the band from source to source but this is not preferred.

Each substantially plane mirror system may comprise a single planar mirror, or a plurality of planar mirrors arranged to be contiguous and coplanar to form a substantially continuous planar reflecting surface. It is also possible to use mirrors which have reflecting surfaces which are slightly convex rather than being exactly planar, without impairing the uniformity of radiation and the term "substantially planar mirror system" is to be construed as including such mirrors.

Apparatus according to the invention can be used with any wave-length of radiation wherein the radiation source is available in an elongated form, e.g. a tube. One particular application of the invention is in irradiating photopolymer printing rolls in order selectively to cure the surface of the roll so that after subsequent processing it has a relief printing surface. In such application exposure of the roll to ultra-violet light is required and the elongated sources of radiation will be ultra-violet tubes. In this embodiment the reflectors and the planar mirror systems may be specially treated to give reflection of ultra-violet light without any substantial loss of intensity.

The invention may be better understood from the following more detailed description thereof, given by way of example only, with reference to the accompanying drawings in which:

FIGS. 1 and 3 illustrate the invention schematically, FIG. 1 being a schematic perspective view of apparatus according to the invention;

FIG. 2 being a cross section on the line II—II of FIG. 1; and

FIG. 3 being a plan view of the arrow III of FIG. 2;

FIG. 5 is a section on line V—V of FIG. 4, to reduced scale; and

FIG. 6 is a section on line VI—VI of FIG. 4.

Figure 4:
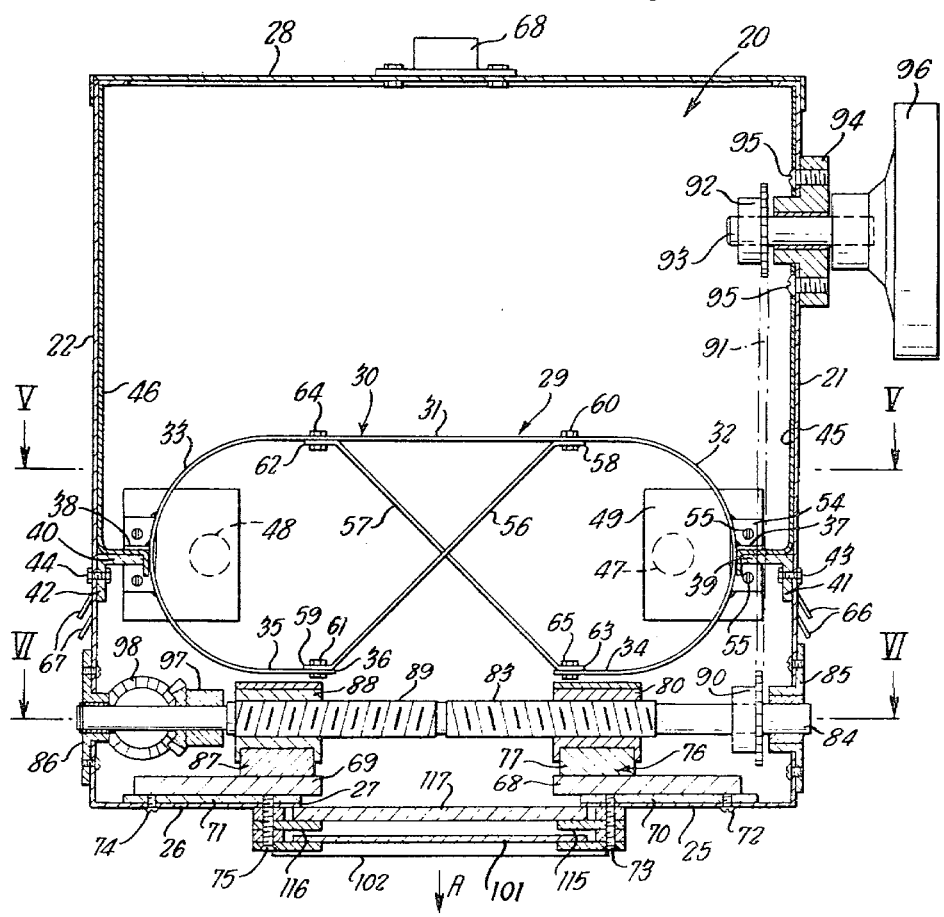
FIG. 4 is a transverse cross-section, taken on line IV—IV of FIG. 6, of a production embodiment of apparatus according to the invention.

The apparatus schematically shown in FIGS. 1 to 3 is designed for irradiating a surface 1, and comprises three units shown generally as 2, 3 and 4, placed end to end. Each unit is similar in construction and comprises an ultra-violet tube, a parabolic reflector and a planar mirror system. Thus, unit 2 comprises tube 5, parabolic reflector 6 and planar mirror 7; unit 3 comprises tube 8, parabolic reflector 9 and planar mirror system 10; and unit 4 comprises tube 11, parabolic reflector 12 and planar mirror system 13. Each of the tubes 5, 8 and 11 is mounted at each end in a conventional holder such as is shown at 14 and 15 in FIGS. 2 and 3. The two holders 14 for tube 8 are connected by a support 16 to which the reflector 9 is also secured, and a similar arrangement is provided for each of the other tubes. The assembly is such that the longitudinal axes of the three tubes 5, 8 and 11 lie in a common plane A—A which includes the longitudinal axis B—B of the apparatus.

Each of the parabolic reflectors 6, 9 and 12 is disposed so that it directs radiation from the tubes 5, 8 and 11 in a band of substantially uniform intensity towards the longitudinal axis of the apparatus and generally parallel to the common planar. Each of the plane mirror systems 7, 10 and 13 comprises two mirrors 7a, 7b; 10a, 10b; and 13a, 13b secured together at the center of the respective mirror system and both mirrors of each system extend in a plane at 45° to the common plane A—A for reflecting the band of radiation received from the respective parabolic reflector through 90° and towards the surface 1. The apparatus is arranged so that the tube 8 and the parabolic reflector 9 lie to the opposite side of the axis B—B both from the adjacent tube 5 and reflector 6 and from the adjacent tube 11 and reflector 12. The plane of the mirror system 10 is at 90° to the plane of the mirror systems 7 and 13 of the two adjacent units.

The adjacent ends of the mirror systems 7 and 10 are contiguous, and the adjacent ends of mirror systems 10 and 13 are also contiguous, although in each case the contact only occurs in the region of the axis B—B of the apparatus. The length of each planar mirror system is shorter than the length of the associated parabolic reflector which is in turn shorter than the length of the associated tube. To exemplify this FIG. 3 shows the distance d1 between one end of the mirror system 10 and the end of the mounting means 14 for the tube 8, and the equal distance d2 between one end of the mirror system 7 and the end of the mounting means 15 for the tube 5. A similar arrangement is present at the juncture of mirror systems 10 and 13, while at one end of the apparatus the opposite end of tube 5 to that shown in FIG. 3 lies beyond the opposite end of the mirror 7 by a similar distance to d2, and at the other end of the system that end of tube 11 lies beyond the end of the mirror system 13 by a similar distance. Referring again to the juncture of the mirror systems 7 and 10 shown in FIG. 3, it will be noted that the end of the tube 8 and its mounting means 14 are shielded from the associated planar mirror system 10 by the rear surface of the planar mirror system 7 of the adjacent unit 2. Similarly the end of the tube 5 and its mounting means 15 is shielded from the associated planar mirror system 7 of unit 2 by the rear surface of the mirror system 20 of the unit 3. Obviously a similar shielding occurs at the juncture of planar mirror system 10 and 13. Separate shielding pieces may be mounted at each end of the apparatus to shield the respective ends of the tubes and their mounting means from the ends of the mirror systems 7 and 13.

This arrangement of shielding the ends of the tubes and their mounting means from the associated mirror systems effectively hides the "dead" areas of the tubes and exposes to the associated mirror systems only a length of tube which provides substantially uniform intensity of radiation. This band of radiation is then directed by the mirror system towards the surface 1 to be exposed and the cumulative constant intensity of radiation impinges on the surface 1, as long as all the tubes have the same radiant output.

The apparatus shown in the drawings relies on three adjacent units, but it will be understood that only two units may be provided, or that four or more units may be present. If only two units are present they must be disposed to opposite sides of the axis B—B in the same manner as units 2 and 3. If four or more units are provided then adjacent units must be provided to alternate sides of the axis B—B.

Details of the mounting of the holders for the tubes, of the parabolic reflectors and of the plane mirrors of the units have not been shown in FIGS. 1 to 3, as these are merely schematic to illustrate the principal of the invention and such mountings can take any one of a number of different forms appropriate to the equipment in which the apparatus is to be used.

Referring now to FIGS. 4 to 6 these show apparatus comprising a casing generally shown as 20 and composed of sidewalls 21 and 22, end walls 23 and 24, bottom wall sections 25 and 26 defining therebetween a slot 27 extending longitudinally of the casing, and a top wall 28. The walls may be assembled and secured together in any suitable fashion to form the casing. The casing may be mounted above a surface to be irradiated, and again such mounting may be effected in any convenient manner, details thereof not being shown in the drawings. Suffice it to say that the surface to be irradiated lies below the casing in the direction of the arrow A in FIG. 4.

Mounted within the casing is a lamp and reflector unit shown generally as 29. This unit comprises a main housing member 30 extending substantially the full length of the casing and defining an upper wall 31, parabolic side walls 32 and 33 and lower wall sections 34 and 35 which terminate to leave therebetween a slot 36 extending longitudinally the full length of the housing 30. The housing also comprises end walls 37 and 38, the end wall 37 being omitted from FIG. 4 for the sake of clarity. The housing 30 is made from stainless steel and the inner surfaces of the parabolic sidewalls are polished to a mirror finish. Welded to the outer surface of each side wall is a longitudinal strip 37, 38 respectively and these strips extend the full length of the housing 30. In order to support the housing 30 within the casing 20 the strips 37 and 38 rest on the horizontal webs 39, 40 respectively of angle irons, the vertical webs 41 and 42 of which are secured by a series of bolts such as 43 and 44 respectively to the side walls 21 and 22 of the casing. Interposed between the strips 37, 38 and their respective angle iron supports are sheets 45, 46 of heat insulating material, which also extend up the inner surface of the side walls 21 and 22.

Mounted within the housing 30 are two ultraviolet tubes 47 and 48 respectively. The tube 47 is held by conventional tube holders 49 and 50 secured to the side wall 32 of the housing 30. The tube 48 is held by conventional tube holders 51 and 52 secured to the side wall 33 of the housing 30. Each tube holder is secured to its respective side wall in the same manner and only the securing system for the tube holder 49 will be described in detail, it being understood that the others are substantially identical. In order to accommodate the tube holder 49 an opening is cut in the side wall 32 which is sufficiently large to accommodate the tube holder, and a recess 53 is cut in the horizontal web 39 of the respective angle iron. A mounting plate 54 is positioned at one side of the cut-out section in the wall 32 and is welded to the material of the wall. Screws 55 are passed through the mounting plate 54 into the tube holder 49, which is thus secured in position in the opening in the side wall 32. The mounting arrangement for the tube holders is such that the longitudinal axis of the respective tube extends along the focal axis of the inner parabolic reflecting surface of the side wall and radiation from the tube will thus be directed in a substantially parallel band towards the center of the housing 30.

Associated with the tube 47 is a first planar mirror 56 and associated with the second tube 48 is a second planar mirror 57. The mirror 56 has upper and lower flanges 58 and 59 which are secured by bolts 60 and 61 respectively to the upper wall 31 and lower wall section 35 of the housing. The mirror 57 has upper and lower flanges 62 and 63 which are secured by bolts 64 and 65 to the upper wall 30 and lower wall section 34 of the housing 30. The mirrors 56 and 57 may again be made from stainless steel having a polished reflecting surface facing towards the respective tube. The two mirrors are contiguous along the center line of the housing 30 as is readily shown from FIG. 5. The position of the tube holder 50 for the tube 47 is such that the holder and end section of the tube 47 lies behind the rear surface of the plane mirror 57, and the position of the tube holder 51 for the tube 48 is such that that holder and the end section of that tube lie behind the rear surface of the reflector 56. Thus, the dead area of the tube 47 is shielded from its associated mirror 56 and the dead area of the tube 48 is shielded from its associated mirror 57. Thus, radiation from the effective length of tube 47 will be directed from the reflector 32 onto the planar mirror 56 and thence downwardly through the slots 36 and 27 towards the surface to be irradiated in the direction of the arrow A. Similarly, radiation from tube 48 will be reflected from the reflector 33 towards the planar mirror 57 and thence downwardly towards the surface to be irradiated. By masking off the tube holders and end regions of the tubes where the radiation tends not to be uniform it will be seen that a substantially uniform intensity of radiation is directed through the slots along the full length of the planar mirror 56 and 57 with the exception of the extreme end regions thereof.

Mounted in the casing 20 above the housing 30 is the necessary electrical equipment and control gear for the tubes 47 and 48, which is not shown in the drawings as it forms no part of the invention. During operation, substantial heat is generated and the side walls 21 and 22 of the casing are therefore provided with louvres 66 and 67 respectively, and one or more fittings such as 68 to which an extractor fan may be connected are secured over openings in the top wall 28 of the casing.

It is desirable to be able to vary both the width and the length of the band of radiation directed to the surface and FIGS. 4 and 6 show details of one way in which such adjustment may be effected. FIG. 6 also shows in chain outline part of the tube and reflector assembly which in fact lies above the section line of that Figure.

The width of the band of radiation may be adjusted by the movement towards and away from the longitudinal axis of the apparatus of two shutters 68 and 69. The shutters are equally spaced to either side of the longitudinal axis and each shutter extends the full length of the housing. The mounting and driving mechanism for the shutters is substantially identical at each end of the housing and only the mechanism at the end 23 will be described in detail. Identical parts at the end 24 of the housing are shown by the same reference numbers with the addition of the suffix a.

The shutters 68 and 69 rest at their ends on pads 70 and 71 respectively of nylon or some other low friction material. The pads are secured in position on the inner surface of the bottom wall section 25 and 26 by screws 72, 73 and 74, 75 respectively. Secured to the upper surface of the shutter 58 is an inverted saddle-shaped member 76 having a base 77 and upstanding sections 78 and 79 and which partially surrounds a nut 80. The nut 80 has outwardly projecting flanges 81 and 82 between which the sections 78 and 79 fit so that the member 76 is constrained to move axially with the nut. The spacing between the sections 78 and 79 is greater than the outer diameter of the main body of the nut in order to allow for transverse movement of the member 76 relative to the nut on longitudinal expansion due to heat of the shutter 68. The nut 80 has internal threads which engage an externally threaded section 83 of a shaft 84 supported in bearings 85 and 86 secured to the side walls 21 and 22 respectively of the casing.

The shutter 69 has on its upper surface an inverted saddle-shaped member 87 similar to the member 76 and which engages a further nut 88 in the same way as member 76 engages nut 80. The nut 88 is internally threaded and engages a further threaded section 89 of the shaft 84, the threads on the sections 83 and 89 being of opposite hand.

Towards one end of the shaft 84 a chain wheel 90 is secured to the shaft and a chain 91 extends upwardly therefrom to a further chain wheel 92 mounted on a stub-shaft 93. The stub-shaft 93 is rotatably mounted in a bearing 94 secured by screws 95 to the side wall 21 and carries at its free end a hand-wheel 96 having divisions marked thereon which lie adjacent to an indicator secured to the side wall 21 and not shown in the drawing.

Towards the other end of the shaft 84 there is secured thereto a bevel gear 97 which meshes with a further bevel gear 98 secured to a shaft 99 extending longitudinally substantially the full length of the casing 20. The shaft 99 is supported in bearings 100 and 100a at opposite ends of the casing. At its end adjacent to bearings 100a the shaft 99 carries a bevel gear 98a which meshes with a bevel gear 97a on a shaft 84a carrying nuts 80a and 88a. Thus the shutter 68 is connected to move with nuts 80 and 80a at its opposite ends, and the shutter 69 is connected to move with nuts 88 and 88a at its opposite ends. Such movement is effected by rotation of the hand-wheel 96 whereupon the chain 91 rotates the shaft 84 and, through the intermediary of the bevel gears and the shaft 89, the shaft 84a. This rotation will cause simultaneous movement of the shutters 68 and 69 in opposite directions either towards the longitudinal axis of the slot 27 or away from the longitudinal axis of the slot 27. Movement towards the longitudinal axis of the slot 27 will cause the effective width of the band of radiation to be reduced, while movement away from the longitudinal axis of the slot 27 will increase that width.

The effective length of the band of radiation may be adjusted by opaque flexible curtains 101, 101a stored on reel assemblies 102 and 102a at opposite ends of the housing. As the assemblies are identical except for being of opposite hand only the assembly 102 will be described in detail. The assembly 102 comprises a housing 103 secured to the end wall 23 of the casing 20 by brackets 104, 105 and screws such as 106. The housing has end walls 107 and 108 in which are mounted bearings 109, 110 supporting spindles 111, 112 extending from opposite ends of a reel 113 on which is wound the curtain material 101. A handwheel 114 is secured to the spindle 112 for rotating the reel 113. The curtain 101 leaves the housing 102 through a slot (not shown) and its opposite edges are received in guide channels 115 and 116 respectively formed by an assembly of strips secured to the lower wall sections 25 and 26 by the scress 73 and 75 and extending the full length of the casing 20. The screw and strip assembly also serve to support a sheet of glass 117 beneath the slot 27 in the lower wall of the casing 20. The curtains 101 are made of a material sufficiently flexible to be wound on their respective reels and yet sufficiently rigid to retain a substantially flat shape when moving in the guide channels 115 and 116. The curtains 101 and 101a may be wound off their respective reels to move along the guide channels towards the lateral central axis of the apparatus and thus to reduce the effective length of the band of radiation. When wound back on to their reels the effective length of the slot will be increased. In use the limit position of the curtain 101 is desirably as indicated by the broken line 101b in FIG. 6, where it will be seen that the curtain has the effect of masking off the holder 49 of tube 47 and thus preventing transmission of the nonuniform radiation from that end of the tube. The curtain 101a is desirably positioned to perform a similar masking function with respect to tube holder 52.

It will be understood that different shutter arrangements may readily be designed for limiting both the width and length of the slot through which the radiation passes. The tube and reflector assembly may be constructed in ways different to that particularly described, and this assembly may be mounted within a housing in any one of a number of different ways. The housing itself may be constructed differently from that shown in the drawings.

I claim:

1. Apparatus for use in providing light radiation along an elongated surface in such a manner that the intensity of radiation may be substantially uniform along substantially the entire length of the surface, the apparatus comprising first mounting means for mounting a first elongated source of radiation; second mounting means for mounting a second elongated source of radiation in such a way that the longitudinal axes of the sources lie in a common plane which includes the longitudinal axis of the apparatus and that the first and second sources lie to opposite sides of the longitudinal axis of the apparatus and partially overlap in the axial direction; a first reflector directing radiation from the first source in a first band of substantially uniform intensity towards the longitudinal axis of the apparatus and generally parallel to the common plane; a first substantially planar mirror system extending at substantially 45° to the common plane for reflecting the first band of radiation through substantially 90° and towards the surface; a second reflector for directing radiation from the second source in a second band of substantially uniform intensity towards the longitudinal axis of the apparatus and generally parallel to the common plane; and a second substantially planar mirror system extending at substantially 90° to the first substantially planar mirror system for reflecting the second band of radiation through substantially 90° and towards the surface; the first and second substantially planar mirror systems having adjacent ends which are contiguous along the axis of the apparatus, that part of the first mounting means for mounting a first end of the first source being shielded from the first substantially planar mirror system by the rear surface of the second substantially planar mirror system, and that part of the second mounting means for mounting a first end of the second source being shielded from the second substantially planar mirror system by the rear surface of the first substantially planar mirror system.

2. Apparatus according to claim 1 and including third mounting means for mounting a third elongated source of radiation in such a way that the longitudinal axis of the third source lies in said common plane, the third source is axially spaced from the first source, and the second and third sources lie to opposite sides of the longitudinal axis of the apparatus and partially overlap in the axial direction; a third reflector for directing radiation from the third source in a third band of substantially uniform intensity towards the longitudinal axis of the apparatus and generally parallel to the common plane; a third substantially planar mirror system for reflecting the third band of radiation through substantially 90° and towards the surface, the third substantially planar mirror system being substantially coplanar with and axially spaced from the first substantially planar mirror system and having an end which is adjacent to an end of the second substantially planar mirror system and is contiguous therewith along the axis of the apparatus, that part of the third mounting means for mounting a first end of the third source being shielded from the third substantially planar mirror system by the rear surface of the second substantially planar mirror system and that part of the second mounting means for mounting a second end of the second source being shielded from the second substantially planar mirror system by the rear surface of the third substantially planar mirror system.

3. Apparatus according to either one of claims 1 or 2 in which the mounting means are such that the longitudinal axes of the sources of radiation are equally spaced from the longitudinal axis of the apparatus; the reflectors are of similar size transverse to the axial direction, of similar reflectance and are equally spaced from their respective sources; and the substantially planar mirror systems are of similar size transverse to the axial direction, of similar reflectance and are equally spaced from their respective sources.

4. Apparatus according to either one of claims 1 or 2 so constructed that each band of radiation passes from the associated substantially planar mirror system towards the surface through a common slot extending in a plane parallel to the common plane and having a longitudinal axis parallel to the longitudinal axis of the apparatus and coplanar therewith in a plane perpendicular to the common plane.

5. Apparatus according to claim 4 and including means for adjusting the width of the common slot.

6. Apparatus according to claim 4 in which the common slot has its longitudinal edges defined by respective ones of a pair of shutters equally spaced to either side of the longitudinal axis of the common slot.

7. Apparatus according to claim 6 in which the means for adjusting the width of the common slot comprises means for moving the shutters equally towards and away from the longitudinal axis of the common slot.

8. Apparatus according to claim 4 in which the axial length of the common slot is less than the combined axial length of the planar mirror systems.

9. Apparatus according to claim 4 and including curtain means movable longitudinally from each end of the apparatus to adjust the effective length of the common slot.

10. Apparatus according to either one of claims 1 or 2 in which all the mounting means, reflectors and substantially planar mirror systems are housed in a common enclosure and means are provided for cooling the common enclosure.

* * * * *